US010113872B2

(12) United States Patent
Falorni et al.

(10) Patent No.: US 10,113,872 B2
(45) Date of Patent: *Oct. 30, 2018

(54) MICRO-ELECTRO-MECHANICAL DEVICE WITH COMPENSATION OF ERRORS DUE TO DISTURBANCE FORCES, SUCH AS QUADRATURE COMPONENTS

(71) Applicant: STMICROELECTRONICS S.r.l., Agrate Brianza (IT)

(72) Inventors: Luca Giuseppe Falorni, Limbiate (IT); Carlo Valzasina, Gessate (IT); Roberto Carminati, Piancogno (IT); Alessandro Tocchio, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 12 days.

This patent is subject to a terminal disclaimer.

(21) Appl. No.: 15/610,251

(22) Filed: May 31, 2017

(65) Prior Publication Data

US 2017/0268880 A1    Sep. 21, 2017

Related U.S. Application Data

(63) Continuation of application No. 14/750,840, filed on Jun. 25, 2015, now Pat. No. 9,696,157.

(30) Foreign Application Priority Data

Jun. 30, 2014    (IT) .............................. TO2014A0522

(51) Int. Cl.
*G01C 19/00*    (2013.01)
*B81B 3/00*    (2006.01)
(Continued)

(52) U.S. Cl.
CPC ........ *G01C 19/5712* (2013.01); *B81B 3/0018* (2013.01); *B81B 3/0086* (2013.01);
(Continued)

(58) Field of Classification Search
CPC ........ G01C 19/00; G01C 19/04; G01C 19/16; G01C 19/56; G01C 19/5663;
(Continued)

(56) References Cited

U.S. PATENT DOCUMENTS 5,392,650 A * 2/1995 O'Brien ............. G01C 19/5719
73/514.18
5,456,341 A * 10/1995 Garnjost .............. B60G 17/018
188/378

(Continued)

FOREIGN PATENT DOCUMENTS

CN    101688775 A    3/2010
CN    101688776 A    3/2010
(Continued)

OTHER PUBLICATIONS

Sang Won Yoon, "Vibration Isolation and Shock Protection for MEMS", Jan. 1, 2009, University of Michigan, ISBN: 1-109-12049-4, 98 pages.

*Primary Examiner* — Harshad R Patel
(74) *Attorney, Agent, or Firm* — Seed Intellectual Property Law Group LLP

(57) ABSTRACT

MEMS device having a support region elastically carrying a suspended mass through first elastic elements. A tuned dynamic absorber is elastically coupled to the suspended mass and configured to dampen quadrature forces acting on the suspended mass at the natural oscillation frequency of the dynamic absorber. The tuned dynamic absorber is formed by a damping mass coupled to the suspended mass through second elastic elements. In an embodiment, the
(Continued)

suspended mass and the damping mass are formed in a same structural layer, for example of semiconductor material, and the damping mass is surrounded by the suspended mass.

19 Claims, 5 Drawing Sheets

(51) Int. Cl.
  *G01C 19/5712*    (2012.01)
  *G01C 19/5733*    (2012.01)
  *G01C 19/5747*    (2012.01)

(52) U.S. Cl.
  CPC ..... *G01C 19/5733* (2013.01); *G01C 19/5747* (2013.01); *B81B 2201/025* (2013.01); *B81B 2203/0163* (2013.01)

(58) Field of Classification Search
  CPC ............ G01C 19/5719; G01C 19/5733; G01C 19/574; G01C 19/5712; G01C 19/5747; B81B 3/0018
  See application file for complete search history.

(56) References Cited

U.S. PATENT DOCUMENTS

| | | | | |
|---|---|---|---|---|
| 5,895,850 A * | 4/1999 | Buestgens | ............ | G01C 19/574 73/504.02 |
| 6,006,875 A * | 12/1999 | van Namen | ........... | F16F 7/1011 188/378 |
| 6,067,858 A * | 5/2000 | Clark | ................. | G01C 19/5719 73/504.16 |
| 6,293,148 B1 * | 9/2001 | Wang | ..................... | G01C 19/56 73/504.02 |
| 6,367,786 B1 * | 4/2002 | Gutierrez | ........... | G01C 19/5719 188/378 |
| 6,516,666 B1 * | 2/2003 | Li | ..................... | G01C 19/5719 73/504.02 |
| 6,834,247 B2 * | 12/2004 | Hiedenstierna | ........ | G01C 19/56 356/459 |
| 6,928,874 B2 * | 8/2005 | Painter | ................... | G01C 19/56 33/1 PT |
| 7,284,430 B2 * | 10/2007 | Acar | .................. | G01C 19/5719 73/504.12 |
| 8,020,441 B2 * | 9/2011 | Seeger | ............... | G01C 19/5719 73/504.04 |
| 8,113,050 B2 * | 2/2012 | Acar | ..................... | G01C 19/574 73/504.04 |
| 8,347,717 B2 * | 1/2013 | Seeger | ............... | G01C 19/5719 73/504.12 |
| 8,833,162 B2 * | 9/2014 | Seeger | ............... | G01C 19/5712 73/504.12 |
| 9,170,107 B2 * | 10/2015 | Anac | .................... | G01C 19/574 |
| 9,310,199 B2 * | 4/2016 | Schofield | ........... | G01C 19/5733 |
| 9,696,157 B2 * | 7/2017 | Falorni | ............. | G01C 19/5712 |
| 2005/0199061 A1 | 9/2005 | Acar et al. | | |
| 2006/0162448 A1 * | 7/2006 | Durante | ........... | G01C 19/5747 73/504.13 |
| 2007/0034005 A1 * | 2/2007 | Acar | .................... | G01C 19/5719 73/504.02 |
| 2011/0021272 A1 * | 1/2011 | Grant | ....................... | A63F 13/10 463/30 |
| 2011/0061460 A1 | 3/2011 | Seeger et al. | | |
| 2012/0291549 A1 * | 11/2012 | Seeger | ............... | G01C 19/5719 73/504.12 |
| 2013/0019677 A1 | 1/2013 | Coronato et al. | | |
| 2015/0114112 A1 | 4/2015 | Valzasina et al. | | |
| 2015/0377624 A1 * | 12/2015 | Falorni | ............. | G01C 19/5712 73/504.12 |

FOREIGN PATENT DOCUMENTS

| | | |
|---|---|---|
| CN | 102183246 A | 9/2011 |
| CN | 102356300 A | 2/2012 |
| EP | 2 527 788 A1 | 11/2012 |
| JP | 2014-108501 A | 6/2014 |

\* cited by examiner

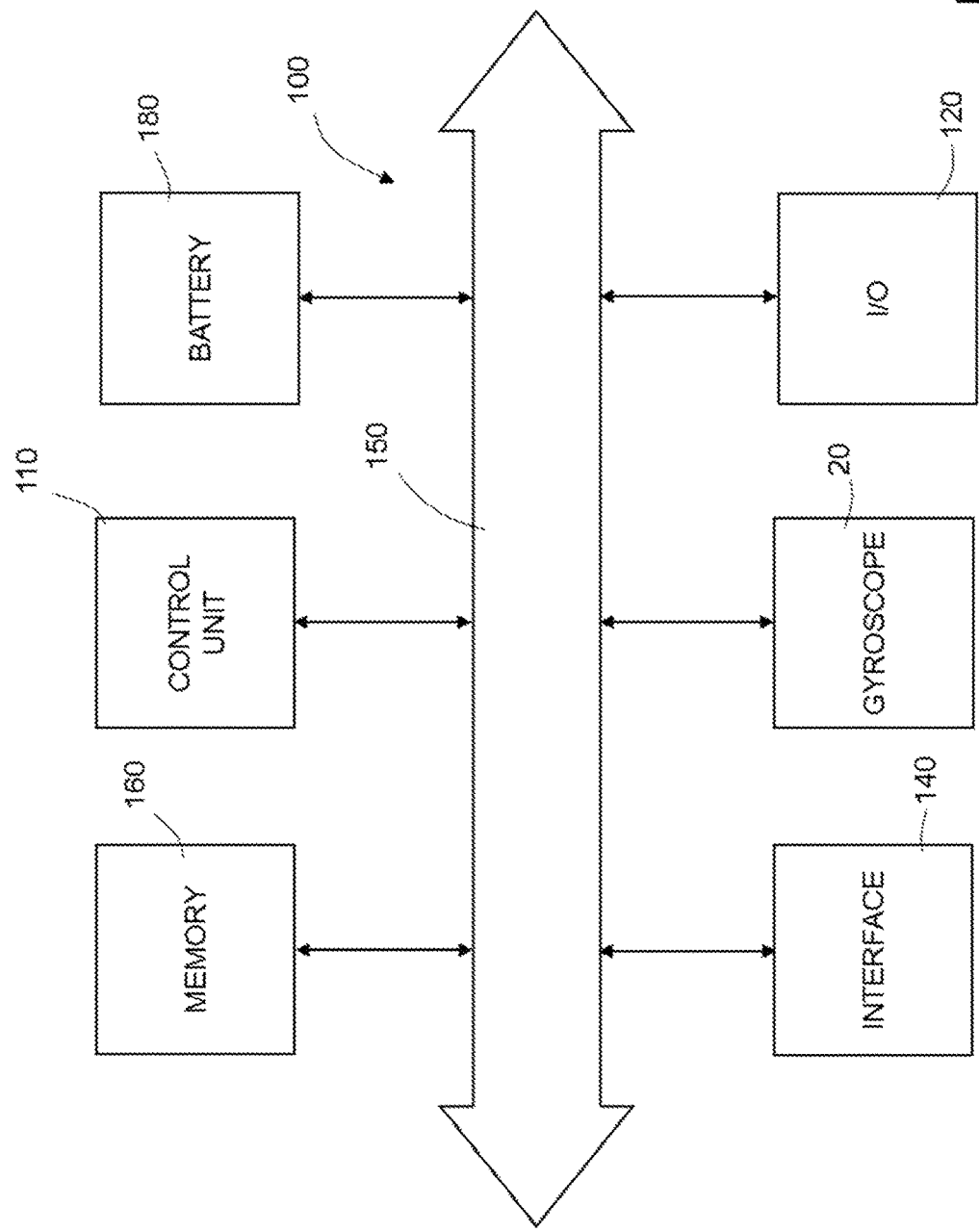

MICRO-ELECTRO-MECHANICAL DEVICE WITH COMPENSATION OF ERRORS DUE TO DISTURBANCE FORCES, SUCH AS QUADRATURE COMPONENTS

BACKGROUND

Technical Field

The present disclosure relates to a micro-electro-mechanical device with compensation of errors due to disturbance forces, such as quadrature components.

Description of the Related Art

As is known, MEMSs (Micro-Electro-Mechanical Systems) are used in an increasingly widespread way in different applications, due to their small dimensions, costs compatible with consumer applications, and their increasing reliability. In particular, with this technology inertial sensors are manufactured, such as microintegrated gyroscopes and electro-mechanical oscillators.

MEMSs of this type are generally based upon micro-electro-mechanical structures comprising a supporting body and at least one mobile mass coupled to the supporting body through springs or "flexures". The springs are configured for enabling the mobile mass to oscillate with respect to the supporting body according to one or more degrees of freedom. The mobile mass is capacitively coupled to a plurality of fixed electrodes on the supporting body, thus forming variable capacitance capacitors. The movement of the mobile mass with respect to the fixed electrodes on the supporting body, for example under the action of external forces, modifies the capacitance of the capacitors; thus, it is possible to detect the displacement of the mobile mass with respect to the supporting body and the external force. Instead, when suitable biasing voltages are supplied, for example through a separate set of driving electrodes, the mobile mass may be subjected to an electrostatic force that causes movement thereof.

To obtain micro-electro-mechanical oscillators, the frequency response of the MEMS structures is usually exploited, which is of a second-order low-pass type, and has a resonance frequency.

MEMS gyroscopes, in particular, have a complex electro-mechanical structure, which typically comprises at least two masses that are mobile with respect to the supporting body, coupled to each other so as to have a number of degrees of freedom depending upon the architecture of the system. In the majority of cases, each mobile mass has one or two degrees of freedom. The mobile masses are capacitively coupled to the supporting body through fixed and mobile sensing and driving electrodes.

In an implementation with two mobile masses, a first mobile mass is dedicated to driving and is kept in oscillation at the resonance frequency at a controlled oscillation amplitude. The second mobile mass is driven with oscillatory (translational or rotational) motion and, in case of rotation of the microstructure about a gyroscope axis at an angular velocity, is subjected to a Coriolis force proportional to the angular velocity itself. In practice, the second (driven) mobile mass acts as an accelerometer that enables detection of the Coriolis force and detection of the angular velocity. In another implementation, a single suspended mass is coupled to the supporting body to be mobile with respect to the latter with two independent degrees of freedom, and precisely one driving degree of freedom and one sensing degree of freedom. The latter may include a movement of the mobile mass in the plane ("in-plane movement") or perpendicular thereto ("out-of-plane movement"). A driving device keeps the suspended mass in controlled oscillation according to one of the two degrees of freedom. The suspended mass moves on the basis of the other degree of freedom in response to rotation of the supporting body about a sensing axis, because of the Coriolis force.

As has been mentioned, to enable the MEMS gyroscope to operate properly, a driving force is applied that keeps the suspended mass in oscillation at the resonance frequency. A reading device then detects the displacements of the suspended mass. These displacements represent the Coriolis force and the angular velocity and may be detected using electrical reading signals correlated to variations of the capacitance between the second (driven) mass and the fixed electrodes.

However, MEMS gyroscopes have a complex structure and frequently have non-ideal electro-mechanical interactions between the suspended mass and the supporting body. Consequently, the useful signal components are mixed with spurious components, which do not contribute to the measurement of the angular velocity. The spurious components may depend upon various causes. For instance, manufacturing defects and process spread are potentially inevitable sources of noise, the effect whereof is unforeseeable.

A common defect depends upon the fact that the oscillation direction of the driving mass does not perfectly matches the degrees of freedom desired in the design stage. This defect is normally due to imperfections in the elastic connections between the suspended mass and the supporting body and causes onset of a force directed along the detection degree of freedom of the angular velocity. This force in turn generates an error, referred to as "quadrature error", due to a signal component of unknown amplitude, at the same frequency as the carrier and with a phase shift of 90°.

In some cases, the quadrature components are so large that they may not simply be neglected without introducing significant errors. Normally, at the end of the manufacturing process, calibration factors are used in order to reduce the errors within acceptable margins. However, in many cases, the problem is not completely solved, since the amplitude of the quadrature oscillations may vary during the life of the device. In particular, the supporting body may be subject to deformations due to mechanical stresses or temperature variations. In turn, the deformations of the supporting body may cause unforeseeable variations in the movements of the masses and, consequently, in the quadrature components, which are no longer effectively compensated.

BRIEF SUMMARY

One or more embodiments of the present disclosure may reduce the incidence of the quadrature oscillations in MEMS devices as referred to above.

According to one embodiment of the present disclosure, a micro-electro-mechanical device is provided. In practice, the device uses a dynamic absorber that is able to compensate undesired forces, such as quadrature components of inertial systems, which may cause undesired displacements on a suspended mass. To this end, the dynamic absorber comprises a tuned damping mass, fixed to the suspended mass or system of suspended masses and configured to have a natural frequency tuned to the undesired forces to be compensated. In this way, the damping mass reduces the dynamic response of the suspended mass and stabilizes it.

One embodiment of the micro-electro-mechanical device uses two masses, one of which is mobile with respect to the supporting body and is elastically connected thereto. This mobile mass is coupled to the substrate so as to have two degrees of freedom, dedicated, respectively, to driving and movement sensing, here out of the plane, as a result of the Coriolis force. The other mass works as a dynamic absorber.

BRIEF DESCRIPTION OF THE SEVERAL VIEWS OF THE DRAWINGS

For a better understanding of the present disclosure preferred embodiments thereof are now described, purely by way of non-limiting example, with reference to the attached drawings, wherein:

FIG. 6 shows a simplified block diagram of an electronic system incorporating a MEMS gyroscope.

DETAILED DESCRIPTION

Figure 1:
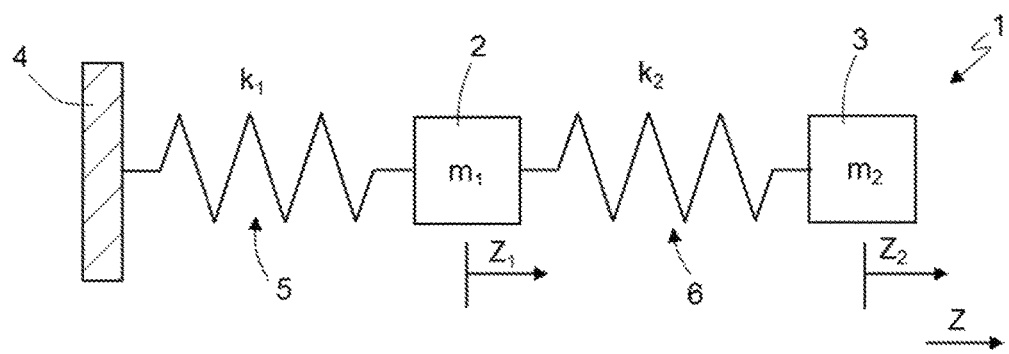
FIG. 1 is a simplified block diagram of a device in accordance with one embodiment.

For an understanding of aspects of the present disclosure, reference will be made to FIG. 1, showing a block diagram of a MEMS device 1, such as a gyroscope, having two degrees of freedom (even though the following considerations also apply to systems having N degrees of freedom).

FIG. 1 schematically shows a MEMS device 1 represented schematically in its basic elements as regards the dynamic behavior according to one degree of freedom (displacement along an axis Z in the presence of undesired components, for example, quadrature components, along this axis), thus neglecting any movements in other directions. The considerations hereinafter are thus aimed at highlighting the conditions whereby the effect of the undesired force in the considered direction is canceled out.

The MEMS device 1 comprises a suspended mass 2 and a damping mass 3. The suspended mass 2 is constrained to a supporting body 4 through a first system of springs 5 having elastic constant $k_1$ and to the damping mass 3 through a second system of springs 6 having elastic constant $k_2$.

Let F be the quadrature force of a sinusoidal type ($F=F_0 \text{sen}(\omega t)$) at the driving frequency $\omega$ in the sensing direction Z. The quadrature force F causes a displacement of the MEMS device 1 in the sensing direction as described by the following system of equations:

$$\begin{cases} m_1 \ddot{z}_1 + k_1 z_1 + k_2 (z_1 - z_2) = F_0 \sin(\omega t) \\ m_2 \ddot{z}_2 + k_2 (z_2 - z_1) = 0 \end{cases} \quad (1)$$

where $z_1$ is the displacement of the suspended mass 2, $z_2$ is the displacement of the damping mass 3, and $k_1$, $k_2$ are the elastic constants of the springs.

The solution of the system (1) is given by displacements of a sinusoidal type:

$z_1(t) = Z_1 \sin(\omega t)$ $z_2(t) = Z_2 \sin(\omega t)$

Setting, for simplicity:

$$\omega_{22} = \sqrt{\frac{k_2}{m_2}} \quad \omega_{11} = \sqrt{\frac{k_1}{m_1}} \quad Z_0 = \sqrt{\frac{F_0}{k_1}}$$

where $\omega_{11}$ and $\omega_{22}$ are the natural frequency of the suspended mass 2 and the natural frequency of the damping mass 3, and substituting $z_1$, $z_2$, $F_0$, $\omega_{11}$ and $\omega_{22}$ in Eq. (1), we obtain $$\begin{cases} \left[1 + \frac{k_2}{k_1} - \left(\frac{\omega}{\omega_{11}}\right)^2\right] Z_1 - \frac{k_2}{k_1} Z_2 = Z_0 \\ -Z_1 + \left[1 - \left(\frac{\omega}{\omega_{22}}\right)^2\right] Z_2 = 0 \end{cases} \quad (2)$$

Solving the system of equations (2) for $Z_1$ and $Z_2$ and normalizing them with respect to $Z_0$ (as defined above) we obtain:

$$\begin{cases} \dfrac{Z_1}{Z_0} = \dfrac{1 - \left(\frac{\omega}{\omega_{22}}\right)^2}{\left[1 + \frac{k_2}{k_1} - \left(\frac{\omega}{\omega_{11}}\right)^2\right]\left[1 - \left(\frac{\omega}{\omega_{22}}\right)^2\right] - \frac{k_2}{k_1}} & (3a) \\ \dfrac{Z_2}{Z_0} = \dfrac{1}{\left[1 + \frac{k_2}{k_1} - \left(\frac{\omega}{\omega_{11}}\right)^2\right]\left[1 - \left(\frac{\omega}{\omega_{22}}\right)^2\right] - \frac{k_2}{k_1}} & (3b) \end{cases}$$

Figure 2A:
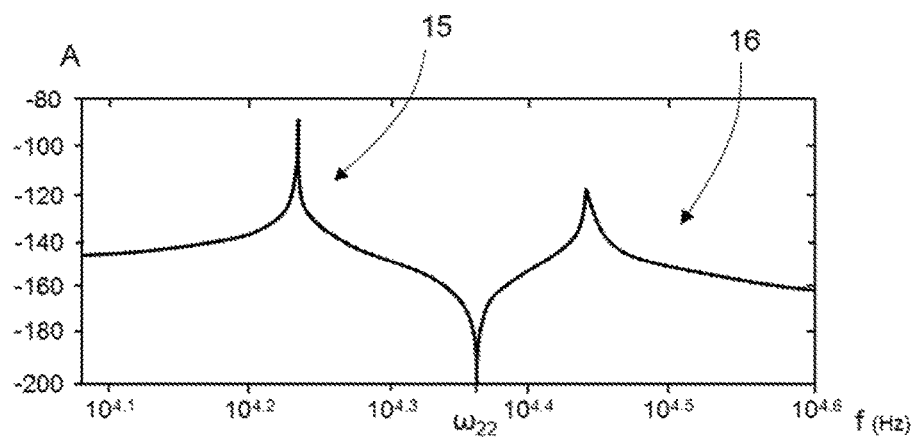
FIGS. 2A and 2B shows amplitude and phase Bode diagrams of the transfer function of the device of FIG. 1.
Figure 2B:
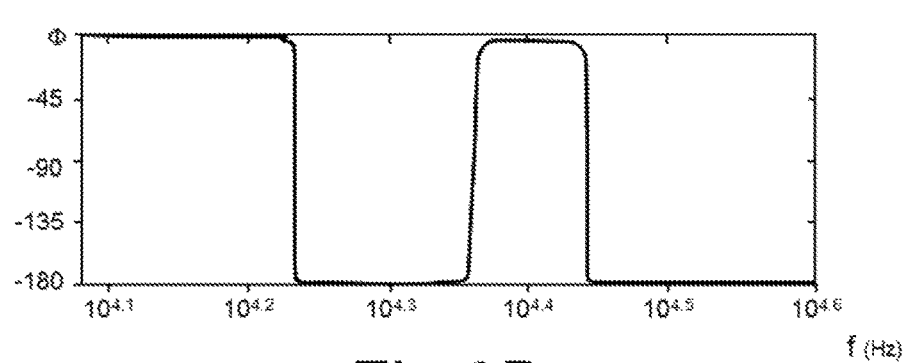

From Eq. (3a) it may be noted that the displacement of the mass $m_1$ (suspended mass 2 of FIG. 1) may be made zero ($Z_1=0$) when $\omega=\omega_{22}$, i.e., when the device 1 is driven at the natural frequency of the damping mass 3. The Bode diagram of the transfer function $Z_1/Z_0$ described by Eq. (3a) is shown in FIGS. 2A and 2B. As may be noted:

At the natural frequency $\omega_{22}$ of the damping mass 3, the amplitude of the displacement $X_1$ of the suspended mass 2 due to the quadrature force F has a minimum;

Two peaks exist at the sides of the natural frequency $\omega_{22}$ and correspond, respectively, to an in-phase mode 15 and to a phase-opposition mode 16, wherein the suspended mass 2 and the damping mass 3 move, with respect to the center, in phase or in phase opposition with respect to each other;

The relative displacement $Z_2/Z_0$ of the damping mass 3 at its natural frequency $\omega_{22}$ is equal to the ratio of the elastic constants $Z_2/Z_0 = k_1/k_2$;

The damping mass 3 dampens the amplitude of oscillation $Z_1$ of the suspended mass 2; and At the natural frequency $\omega_{22}$ of the damping mass 3, the suspended mass 2 is subjected to a system of forces with zero resultant along the sensing direction Z.

Consequently, by actuating the MEMS device 1 at the natural frequency $\omega_{22}$ of the damping mass 3, the suspended mass 2 does not undergo displacements in the considered direction caused by the quadrature force. In practice, the damping mass 3 operates as notch filter or dynamic absorber, analogously to the known solutions for stabilizing skyscrapers and antiseismic buildings.

This behavior may be exploited in a MEMS device when it is desired to prevent spurious displacements in the sensing direction.

Figure 3:
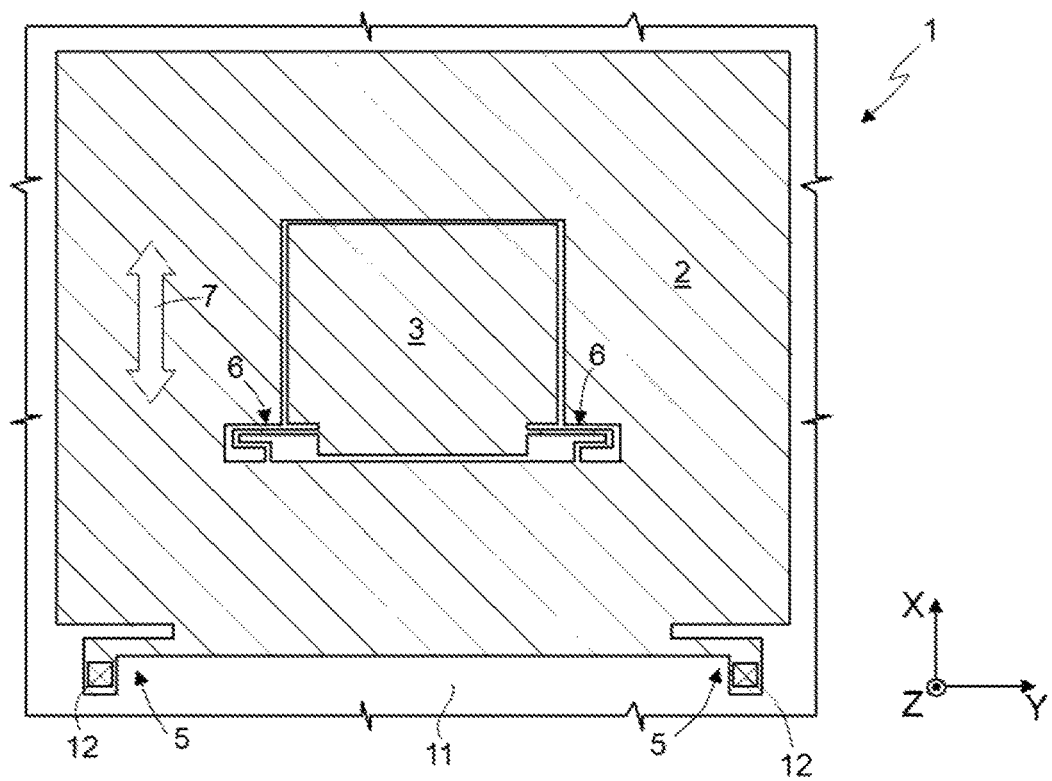
FIG. 3 shows a schematic embodiment of a structure for compensating quadrature components for a MEMS microstructure.
Figure 4:
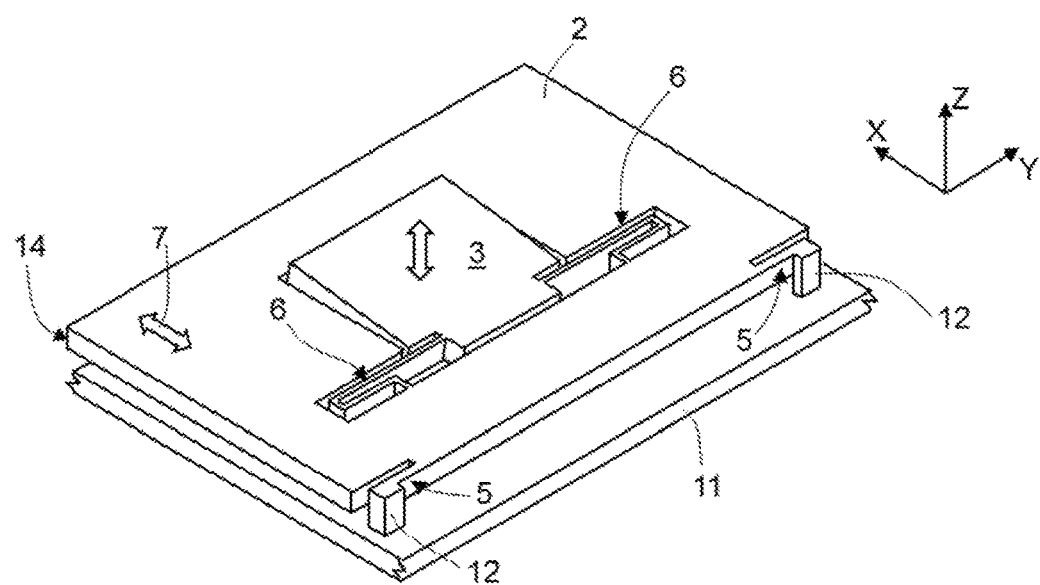
FIG. 4 shows a simulation of the movement of the structure of FIG. 3.

FIGS. 3 and 4 show a possible embodiment of the quadrature component damping solution in a generic MEMS device 10.

Here, the suspended mass 2 surrounds the damping mass 3 and is anchored to a supporting body 11 (FIG. 4) via anchorage regions 12 and the first springs 5. As in FIG. 1, the suspended mass 2 is elastically coupled to the damping mass 3 through the second springs (coupling springs) 6. The second springs 6 are also comprised within the overall dimensions of the suspended mass 2 and are arranged between the latter and the damping mass 3.

The suspended mass 2 and the damping mass 3 are formed in the same structural layer 14, for example of semiconductor material, such as mono- or polycrystalline silicon, and are suspended over the supporting body 11, for example a substrate of semiconductor material, such as monocrystalline silicon.

The suspended mass 2 is driven in the direction of the arrow 7 (direction X) and, due to the springs 5, may move in the direction Z (sensing direction). To this end, fixed electrodes (not shown) are formed over the supporting body 11 and capacitively coupled to the suspended mass 2, in a known manner.

As explained previously, as a result of the quadrature error, an undesired force acts on the masses 2 and 3 in a direction Z perpendicular to the plane of the masses 2, 3. Due to the presence of the damping mass 3 and by driving the suspended mass 2 at the natural frequency $\omega_{22}$ of the damping mass 3, this force is compensated for on the suspended mass 2 and does not cause, to a first approximation, a displacement thereof in the direction Z. Instead, the damping mass 3 undergoes a movement having a component along the axis Z, as shown in FIG. 4. In this way, any movements in the direction Z of the suspended mass 2 are due to different external forces and may thus be detected without substantial errors.

Figure 5A:
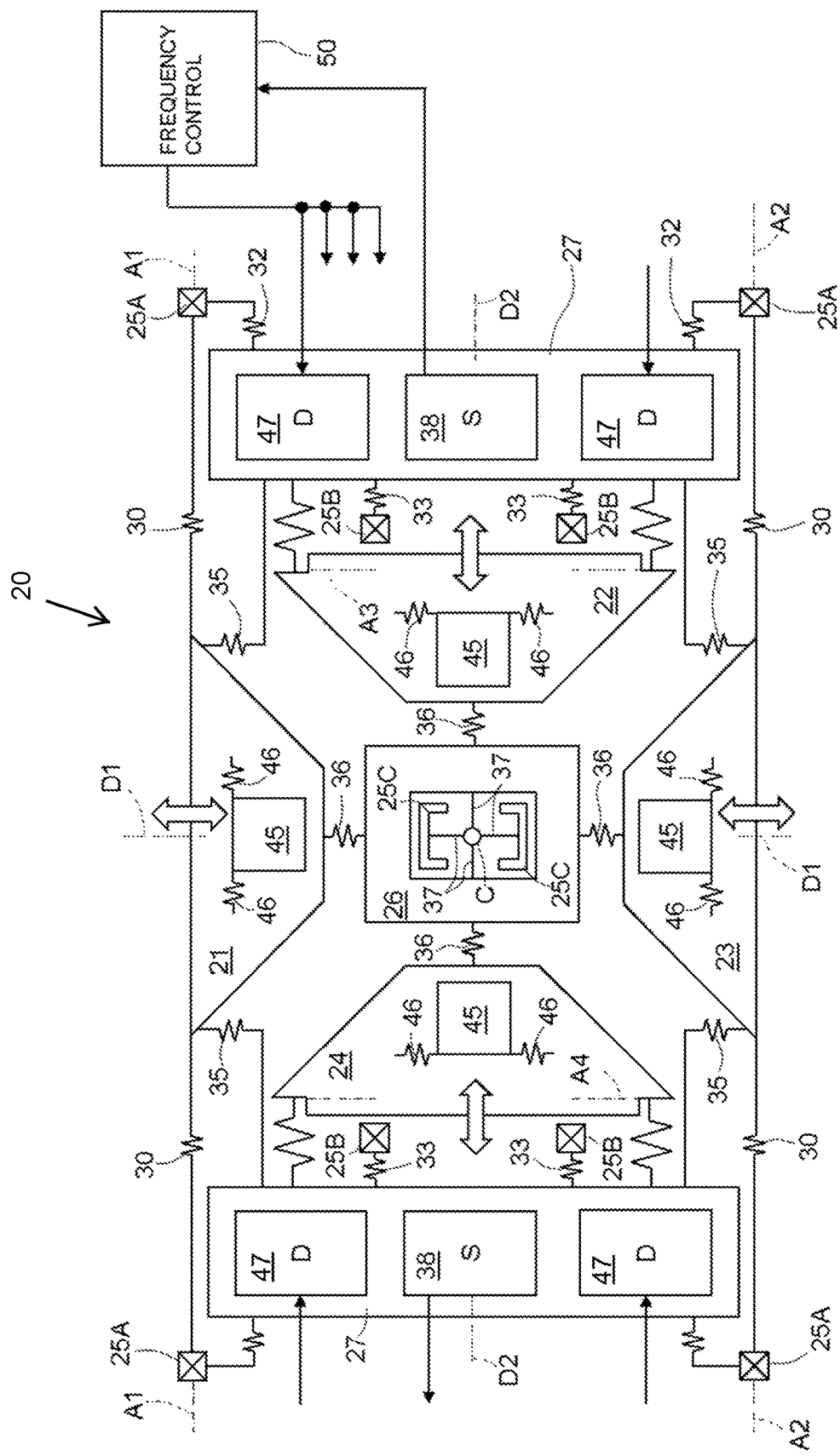
FIG. 5A shows a simplified diagram of a possible embodiment of a MEMS gyroscope provided with the compensation structure of FIG. 3.

An embodiment of a gyroscope using the operating principle described above is shown in FIG. 5A. FIG. 5A shows a gyroscope 20 having four sensing masses 21-24 supported by first, second, and third anchorage regions 25A, 25B and 25C. The support regions 25A, 25B and 25C may be connected to a semiconductor substrate, for example of monocrystalline silicon, not shown in the figures, similar to the supporting body 11 of FIG. 4.

The mobile masses 21-24, all of doped semiconductor material such as polycrystalline silicon, are defined by respective plates having a substantially trapezoidal shape, arranged symmetrically in pairs with respect to a center C of the gyroscope 20 and parallel, in rest condition, to the drawing plane (plane XY). In particular, a first sensing mass 21 and a second sensing mass 23 are driven along a first driving axis D1 and are arranged symmetrically to each other with respect to a second driving axis D2, perpendicular to D1. A third sensing mass 22 and a fourth sensing mass 24 are arranged symmetrically to each other with respect to the first driving axis D1 and are driven along the second driving axis D2.

The first and second sensing masses 21, 23 are connected to the first anchorage regions 25A through first elastic springs 30. The third and fourth sensing masses 22, 24 are connected to the first and second anchorage regions 25A, 25B through two driving structures 27 arranged laterally and externally (with respect to the center C) to the third and fourth sensing masses 22, 24. In detail, the third and fourth sensing masses 22, 24 are connected to the driving structures 27 through second elastic springs 31, and the driving structures 27 are connected to the first and second anchorage regions 25A, 25B through third and fourth elastic springs 32, 33. The first and second sensing masses 21, 23 are further connected to the driving structures 27 through fifth elastic springs 35. Finally, the sensing masses 21-24 are coupled to a central bridge 26, with a square annular shape, through sixth elastic springs 36. The central bridge 26 is in turn coupled to the third anchorage region 25C through seventh elastic springs 37.

The elastic springs 30-37 are configured to provide the sensing masses 21-24 with two degrees of freedom with respect to the support regions 25A-25C. More precisely, the fifth elastic springs 35 are configured to cause the first and second sensing masses 21 and 23 to translate along the first driving axis D1, whereas the third elastic springs 33 are configured to cause the third and fourth sensing masses 22 and 24 to translate along the second driving axis D2. The first, fifth, and sixth springs 30, 35 36 further enable the first and second sensing masses 21 and 23 to tilt about respective sensing axes A1, A2 parallel to each other and perpendicular to the first driving axis D1. The second and sixth springs 32, 36 further enable the second and fourth sensing masses 22 and 24 to tilt about respective sensing axes A3, A4 parallel to each other and perpendicular to the second driving axis D2.

The driving axes D1, D2 and the sensing axes A1-A4 are all parallel to plane XY.

The central bridge 26 is defined by a rigid semiconductor element, having a substantially hollow quadrangular shape, and is in turn independently tiltable about the first and second driving axes D1, D2. In this way, the first and second sensing masses 21, 23 both rotate clockwise or both counterclockwise about the respective sensing axes A1, A2. Likewise, the third and fourth sensing masses 22, 24 both rotate clockwise or both rotate counterclockwise about the respective sensing axes A3, A4. That is, the first, second, third, and fourth sensing masses 21, 22, 23, 24 rotate in and out of the page.

Figure 5B:
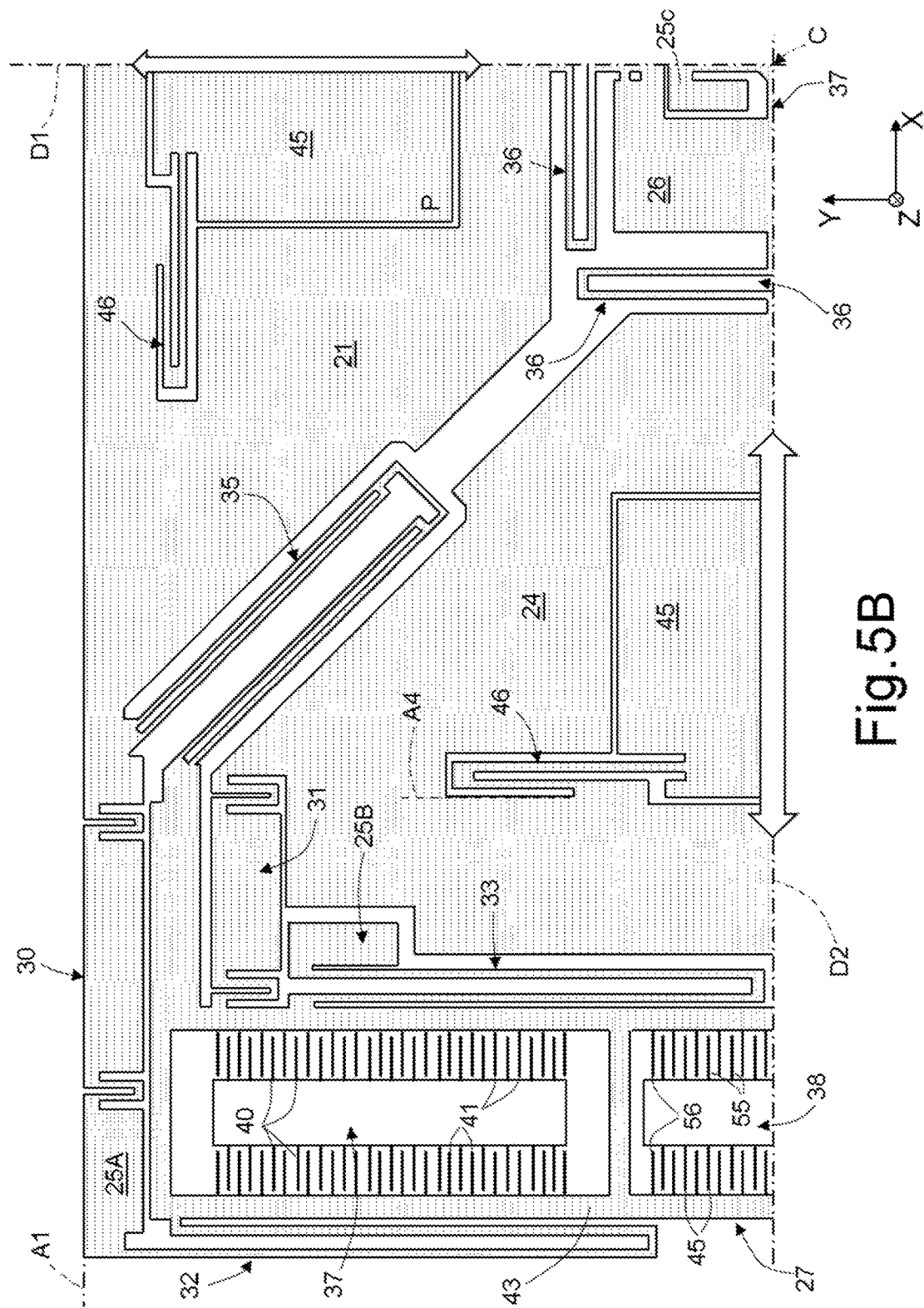
FIG. 5B is a top plan view of a portion of the gyroscope of FIG. 5A, at an enlarged scale.

The driving structures 27 are here each formed by two driving units 47 and by a drive detection unit 38. The units 38 are formed by sets of fixed electrodes 40 and mobile electrodes 41, mutually comb-fingered, as shown in FIG. 5B. The fixed electrodes 40 are connected to the substrate in a way not shown. The mobile electrodes 41 are connected to a mobile frame 43 for each driving structure 27, the frame being connected to the sensing masses 21-14 in the way described above.

In particular, and in a known way, the electrodes 40, 41 of the driving units 47 are biased so as to generate electrostatic, attraction or repulsion forces between the fixed and mobile electrodes 40, 41. These forces cause a movement of the mobile frames 43 in the direction of the second driving axis D2. As referred to above, this movement of the mobile frames 43 is transferred directly and parallel to the second and fourth sensing masses 22, 24 and, as a result of the configuration of the sixth elastic springs 35, perpendicularly to the first and third sensing masses 21, 23.

In a per se known manner, the drive detection unit 38 detects, through its own fixed electrodes 55 and mobile electrodes 56, the effective movement imparted by the driving units 47 in order to ensure a precise control.

In a way known and not shown, sensing electrodes are formed on the substrate, under the sensing masses 21-24, to detect the movement thereof in the direction Z.

Each sensing mass 21-24 further carries a respective damping mass 45. As in the case of FIG. 3, each damping mass 45 is formed within the perimeter of the respective sensing mass 21-24 and is elastically coupled thereto through bilateral springs 46, corresponding to the second springs 6 of FIG. 3.

The damping masses 45 are equal, and are provided in a same structural layer, for example a polysilicon layer, and are all supported in the same way, so as to have the same natural frequency $\omega_{22}$.

As discussed above, by biasing the driving units 47 in such a way that the fixed electrodes 41 and mobile electrodes 42 attract and repel each other with a frequency (driving frequency) equal to the natural frequency $\omega_{22}$ of the damping masses 45 (notch frequency), the sensing masses 21-24 do not undergo a displacement in the respective sensing direction along axis Z due to the quadrature forces. It follows that the reading is not affected by quadrature components.

In use, the drive detection unit 38 is connected to a control circuit (not shown), for example, formed together with the control and reading algorithms of the gyroscope 20 in an ASIC (Application-Specific Integrated Circuit), which enables, in closed loop, a precise control of the driving frequency for keeping it equal to the notch frequency or within a preset range of variability.

Use of a tuned mechanical damping filter thus enables a reduction of the amplitude of the oscillations caused by the quadrature force and other external mechanical forces at the preset frequency. In the specific case of the gyroscope, there are two main advantages:

the electrical signal to be compensated, due to the quadrature forces, is considerably lower than in known implementations; this results in a reduction of the consumption of the ASIC compensation chain and of the output noise;

the variations due to the deformations of the structure during the useful life of the device are reduced in proportion, since the amplitude of the quadrature component is reduced.

The implementation of the mechanical filter does not entail variations in the manufacture steps of the microstructure, but an appropriate design and modification of the layout thereof are sufficient.

Control of the driving frequency is simple. In some cases, no additional component is required since at times MEMS structures already have a driving control system. In any case, insertion of the drive detection unit 38 does not entail any re-design of the MEMS structure, and the routine for controlling the oscillation frequency may be integrated in the ASIC.

FIG. 6 illustrates a portion of an electronic system 100 according to an embodiment of the present disclosure. The system 100 incorporates the gyroscope 20 and may be used in devices such as, for example, a tablet, a laptop, or a portable computer, for example with wireless capacity, a smartphone, a wearable device, a messaging device, a digital music player, a digital photo or video camera, or other device designed for processing, storing, transmitting, or receiving information. For instance, the gyroscope 20 may be used in a digital videocamera to detect movements and carrying out image stabilization. In other embodiments, the gyroscope 20 may be included in a portable computer, a PDA, or a smartphone for detecting a free-fall condition and activating a safety configuration or for activating or controlling functions based upon motion of the device. In a further embodiment, the gyroscope 20 may be included in a motion-activated user interface for computers or consoles for videogames. Again, the gyroscope 20 may be incorporated in a satellite-navigation device and be used for temporarily tracking of the position in case of loss of the satellite-positioning signal.

The electronic system 100 may comprise a controller 110, an input/output device 120, for example, a keyboard or a display, the MEMS device 1, a wireless interface 140, and a memory 160, of a volatile or non-volatile type, coupled together through a bus 150. In one embodiment, a battery 180 may supply the system 100. It should be noted that the scope of the present disclosure is not limited to embodiments that necessarily have one or all of the mentioned devices.

The controller 110, for example, may comprise one or more microprocessors, microcontrollers, and the like. The controller 110 may, for example, be formed in an ASIC and include the components and algorithms for controlling the drive frequency on the basis of the signals supplied by the drive detection unit 38.

The input/output device 120 may be used for generating a message. The system 100 may use the wireless interface 140 for transmitting and receiving messages to and from a wireless communication network with radiofrequency signal. Examples of wireless interface may comprise an antenna, a wireless transceiver, such as a dipole antenna, even though the disclosure is not limited thereto. Furthermore, the input/output device 120 may supply a voltage representing what is stored in digital or analogue form.

Finally, it is clear that modifications and variations may be made to the solution described and illustrated herein, without thereby departing from the scope of the present disclosure.

In particular, the use of a mechanical filter of the described type may be implemented in various types of MEMS microstructures of an inertial type.

Furthermore, this solution may be applied to microstructures with a different number of degrees of freedom by providing each degree of freedom with an appropriate tuned damper.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A gyroscope comprising:
   a substrate;
   elastic elements;
   a drive system; and
   a plurality of movable mass systems elastically coupled to the substrate and the drive system by the elastic elements, the plurality of movable mass systems being configured to be driven by the drive system, each of the plurality of movable mass systems including:
      a suspended mass configured to be subjected to disturbance forces; and
      a damping mass coupled to the suspended mass by elastic elements and configured to resonate at its natural frequency in response to the respective movable mass systems being driven by the drive system, the damping mass being configured to reduce movements of the suspended mass due to the disturbance forces.

2. The gyroscope of claim 1, wherein the respective damping masses are located in respective openings of the respective suspended masses.

3. The gyroscope of claim 2, wherein the elastic elements coupling the damping mass to the suspended mass have a first elastic constant and the elastic elements coupling the plurality of movable mass systems to the substrate and the drive system have a second elastic constant that is different from the first elastic constant.

4. The gyroscope of claim 1, wherein the plurality of movable mass systems includes first and second pairs of movable mass systems, the first pair of movable mass systems being arranged relative to a first axis, the second pair of movable mass systems being arranged relative to a second axis, the second axis being transverse to the first axis.

5. The gyroscope of claim 4, wherein the drive system is configured to drive the first pair of movable mass systems in a first direction that corresponds to the first axis, and wherein the drive system is further configured to drive the second pair of movable mass systems in a second direction that corresponds to the second axis.

6. The gyroscope of claim 1, wherein each of the plurality of movable mass systems has a trapezoidal shape.

7. The gyroscope of claim 1, wherein the respective damping masses are configured to absorb respective quadrature forces acting on the movable mass systems, respectively, in response to the gyroscope being rotated.

8. The gyroscope of claim 1, wherein each of the suspended masses and the damping masses are formed in a same structural layer.

9. The gyroscope of claim 8, wherein the structural layer is made of a semiconductor material.

10. The gyroscope of claim 8, wherein the drive system drives the plurality of movable mass systems relative to a central axis.

11. An electronic device comprising:
a controller; and
a gyroscope coupled to the controller, the gyroscope including:
elastic elements;
a drive system; and
first and second movable mass systems elastically coupled to the drive system by the elastic elements and configured to be driven by the drive system, the first movable mass system including a first suspended mass and a first damping mass coupled to the first suspended mass by elastic elements, the second movable mass including a second suspended mass and a second damping mass coupled to the second suspended mass by elastic elements, the first and second suspended masses configured to be subjected to quadrature forces, the first and second damping masses configured to resonate at their natural frequency in response to being driven by the drive system, the first and second damping masses being configured to reduce movements of the first and second suspended masses, respectively, due to the quadrature forces.

12. The electronic device according to claim 11, wherein the first and second damping masses are located in openings of the first and second suspended masses, respectively.

13. The electronic device according to claim 11, wherein the drive system is configured to drive the first and second movable mass systems in a first plane, wherein the quadrature forces are perpendicular to the first plane.

14. The electronic device according to claim 13, wherein first and second movable mass systems are aligned relative to each other along a first axis, and wherein the drive system drives the first and second movable mass systems in a direction that is parallel to the first axis.

15. The electronic device according to claim 11, wherein the electronic device is at least one of a tablet, a laptop, a portable computer, a smartphone, a wearable device, a messaging device, a digital music player, and a digital photo or video camera.

16. A gyroscope comprising:
a substrate;
a central anchor;
a drive system;
first and second elastic elements; and
a plurality of movable mass systems elastically coupled to the central anchor by the first elastic elements and coupled to the drive system by the second elastic elements, each of the plurality of movable mass systems including:
a suspended mass configured to be subjected to quadrature forces; and
a damping mass coupled to the suspended mass by elastic elements and configured to resonate at its natural frequency in response to being driven by the drive system, the damping mass being configured to reduce movements of the suspended mass due to the quadrature forces.

17. The gyroscope of claim 16, wherein the respective damping masses of the plurality of movable mass systems are located in respective openings of the respective suspended masses of the plurality of movable mass systems.

18. The gyroscope of claim 16, wherein the plurality of movable mass systems are arranged to surround the central anchor.

19. The gyroscope of claim 18, wherein each of the plurality of movable mass systems have a trapezoidal shape.

* * * * *